April 13, 1965 W. E. SLUSHER ETAL 3,178,633

SEMI-CONDUCTOR CIRCUIT

Filed Nov. 12, 1958 2 Sheets-Sheet 1

INVENTOR.

WILLIAM E. SLUSHER

STANLEY KARANDANIS

BY

Ezekiel Wolf, Wolf + Greenfield their attorneys -

SEMI-CONDUCTOR CIRCUIT

Filed Nov. 12, 1958 2 Sheets-Sheet 2

INVENTOR.
WILLIAM E SLUSHER
STANLEY KARANDANIS
BY
Ezekiel Wolf, Wolf + Greenfield
their attorney

United States Patent Office 3,178,633

Patented Apr. 13, 1965

3,178,633

SEMI-CONDUCTOR CIRCUIT

William E. Slusher, Newton, Mass., and Stanley Karandanis, Epping, N.H., assignors, by mesne assignments, to Transitron Electronic Corporation, Wakefield, Mass., a corporation of Delaware Filed Nov. 12, 1958, Ser. No. 773,407
3 Claims. (Cl. 323—22)

The present invention relates in general to semi-conductor devices and more particularly concerns a novel semiconductor amplifier circuit especially suitable for use in a voltage regulator circuit. The novel circuit maintains an output voltage substantially constant in the presence of wide variations in temperature. In a preferred embodiment of the invention, a voltage reference source and temperature-stabilized amplifier are combined in a single semiconductor device. This is advantageous because the physical package is rugged and compact, and temperature-compensated and temperature-compensating circuit elements are subjected to substantially the same temperature.

Semiconductor devices are preferred in numerous circuit applications where amplification is required because they are small, mechanically rugged and consume relatively small amounts of power. Semiconductor rectifying junctions reverse-biased by a source of potential in excess of the Zener breakdown potential of the junction are useful as voltage reference sources since the potential across such junction is nearly constant over a wide range of currents. However, these and other semiconductor devices have operating characteristics which are generally temperature sensitive. In particular, the base-to-emitter potential of a transistor and the Zener potential of a reverse-bias rectifying junction are functionally related to temperature. It is especially difficult to compensate for such temperature variations over a wide range of temperatures because the relationships between these potentials and temperature are nonlinear functions. The potential drop across a normally forward-biased base-emitter junction decreases as temperature increases because the concentration of majority carriers increases. In the case of a reverse-biased rectifying junction functioning as a Zener diode, the sense of the relationship between Zener potential and temperature is a function of the current passing across the junction. Under most normal operating conditions, the sense of this relationship is positive; that is, a rise in temperature is accompanied by a rise in the Zener potential.

The problem is especially serious in connection with attempting to provide a circuit for coupling the voltage of an unregulated power supply to an output terminal where it is desired to maintain the voltage substantially constant. Basically, such circuits include a transistor in series with the unregulated supply and the output terminal. A fraction of the potential on the output terminal is compared with a reference potential maintained by a Zener diode. A transistor amplifier delivers a current to the base of the series transistor which follows changes in the output potential so that the potential drop across the series transistor accommodates changes in the potential of the unregulated supply so as to maintain the potential on the output terminal substantially constant, regardless of load current.

However, the output potential is subject to fluctuations due to changes in temperature because of the temperature sensitivity of the transistor D.-C. amplifier and that of the Zener potential. Heretofore, attempts at a partial solution involve using a pair of transistors having similar temperature coefficients differentially connected. However, significant variations due to temperature changes still occur. This is due in part to the inability to simultaneously match the temperature characteristics of the pair of differentially-connected transistors with those of the Zener diode.

Accordingly, the present invention contemplates and has as an important object the provision of a semiconductor circuit capable of functioning to amplify deviations in an output potential from a prescribed level with amplification being provided by a single transistor which receives the reference potential from one or more voltage reference semiconductor diodes which also function to compensate for temperature-sensitive variations in the characteristics of the single transistor.

Still another object of the invention is to provide a semiconductor circuit in accordance with the preceding object in which the single transistor and temperature-compensating voltage reference diodes are combined in a single semiconductor device so that compensated and compensating rectifying junctions are maintained at substantially the same temperature while at the same time occupying a relatively small volume.

According to the invention, amplification is provided by a semiconductor device having at least first and second oppositely polarized rectifying junctions. The first junction is between emitter and base and is normally forward-biased, the potential drop across this junction being functionally related to temperature in a first sense. One or more voltage reference diodes are connected in series with the first junction, all the reference diodes carrying the same current. The potential across the voltage reference diodes is functionally related to temperature so as to maintain the potential across the series combination of the first junction and the one or more voltage reference diodes substantially constant.

The second junction is typically between the base and the collector. In a typical voltage regulator circuit, the current transmitted across the second junction; that is, the collector current, controls the base current of a transistor in series with an unregulated potential source and an output terminal whose potential is maintained substantially constant by means including the novel circuit.

In one embodiment of the invention, the voltage reference diodes include a stabistor and Zener diode connected in series. Preferably, the invention is embodied by means comprising a single semiconductor device including the first and second junctions and the one or more voltage reference diodes.

A feature of the physical arrangement of the present invention is that the first junction and the junctions defining the voltage reference diodes are essentially thermally connected together. This minimizes temperature gradients between junctions so that transient thermal effects are considerably reduced. Such effects are especially noticeable during the initial warm-up period in prior art devices.

These and other objects and advantages of the present invention will be more clearly understood when considered in conjunction with the accompanying drawings, in which.

Figure 1:
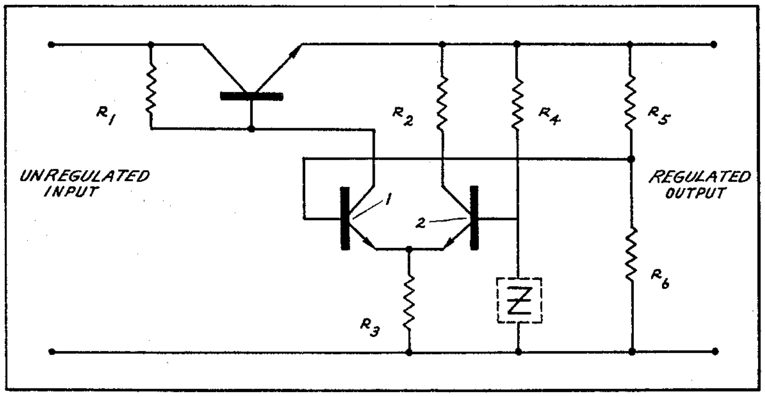
PRIOR ART FIG. 1
FIGURE 1 is a schematic circuit illustrating a typical prior art circuit.

In FIGURE 1 there is shown a typical circuit of the type previously used for purpose of obtaining amplification and voltage reference. Here it will be noted that a pair of transistors 1 and 2 were matched to minimize the effects of temperature on their base-emitter voltage. In addition the voltage reference Z comprises an avalanche diode and two stabistors (diodes biased in a forward direction). Thus this arrangement utilized five semiconductor devices and seven junctions. While this arrangement is an improvement over the utilization of a bare transistor amplifier, it still has a temperature coefficient error in the order of 10% of that previously encountered in the ordinary transistor. This error is due principally to the utilization of two transistors which ordinarily cannot be perfectly matched and in addition to the residual temperature coefficient of the voltage reference Z.

In the present invention a transistor and stabistor are eliminated. In effect in the present invention, a voltage reference device comprising a Zener diode and single stabistor are utilized. For additional compensation of the Zener diode, the base-emitter junction of the transistor, which has been found to have a comparable temperature coefficient is utilized. This general arrangement provides a better overall temperature coefficient than that obtained in the circuit shown in FIGURE 1, because thermal errors of both reference and transistors in the circuit of FIGURE 1 must be added together.

Figure 2:
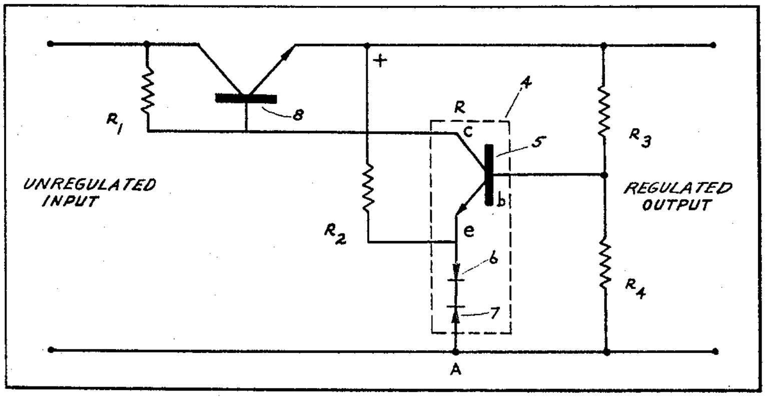
FIGURE 2 is a circuit illustrating a preferred embodiment of the present invention.

As illustrated in a preferred embodiment of the present invention in FIGURE 2, the voltage reference amplifier device comprising the present invention is shown in the broken enclosure indicated at 4 as part of a typical overall circuit. Within this enclosure there is provided a transistor 5 having a base B collector C and emitter E as well as a Zener diode 7 and a stabistor 6, the stabistor and Zener diode both being voltage reference diodes and connected in series to form part of a voltage reference device. The Zener diode is connected to the emitter terminal of the transistor. The transistor has a negative coefficient between the base B and emitter E. The combination of the stabistor and Zener diode 6 and 7 respectively, has a positive temperature coefficient between the terminal A and the emitter E. The reference elements are selected so that the voltage between the terminals A and B have nearly a zero temperature coefficient.

In this arrangement the reference terminal A is supplied with a constant current derived from a regulated output voltage. The base of the transistor B samples a portion of the output voltage and compares it with the reference voltage. The resulting error signal is amplified by the transistor and this amplified current is applied to the next transistor 8 through the collector terminal C. The resistor R2 is used in this arrangement to supply the proper amount of current to the reference components 6 and 7. Resistors R3 and 4 are voltage dividers.

Typical parameters of the device shown in FIGURE 2:

Collector current ($I_c$)≈emitter current ($I_e$)=250 microamps

Zener diode current ($I_z$)=stabistor current ($I_s$)=10 milliamps

Transconductance ($G_m$)≈6000 micromhos

Voltage input e=9.2 volts

Beta min. (B min.)=20

Temperature coefficient (T.C.) of base to emitter=−2.4 millivolts per degree centigrade Temperature coefficient stabistor=−1.5 millivolts per degree centigrade Temperature coefficient: Zener diode=+4.00 millivolts per degree centigrade Temperature coefficient base to ground (A)=0011% per degree centigrade=.010 millivolt per degree centigrade In this arrangement therefore the measure of error of the temperature coefficient of the base to ground is exceedingly small.

It will be noted that the temperature coefficient of base to ground is the difference between the sum of the temperature coefficient of the base to emitter and the temperature coefficient of the stabistor on the one hand and the temperature coefficient of the Zener diode on the other.

This is obvious for as previously pointed out the stabistor and base to emitter temperature coefficient is negative while that of the Zener diode is positive.

Figures 3, 4:
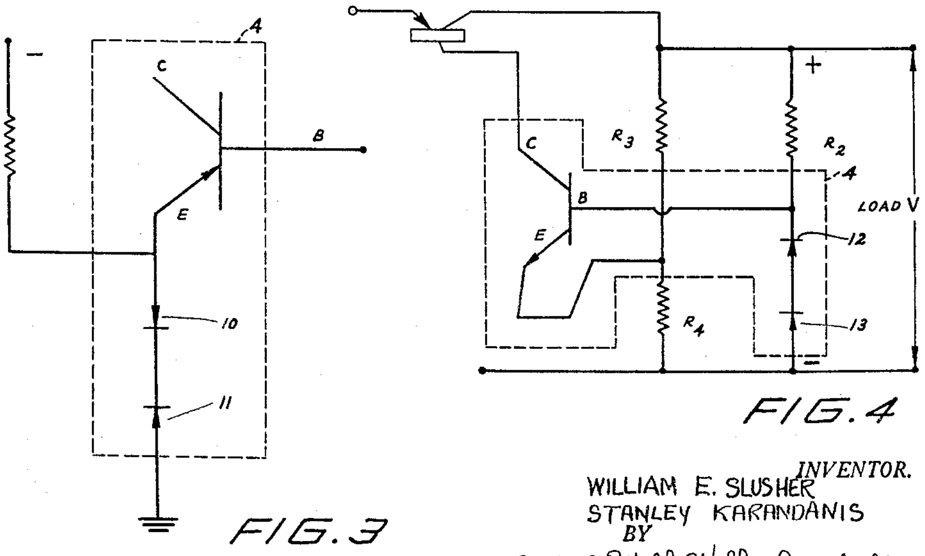
FIG. 3 shows how the novel temperature stabilized circuit may be modified to regulate a negative potential by using an NPN transistor.
FIG. 4 shows another modification of the circuit of FIG. 2 wherein the voltage reference diodes are in series with the base terminal of the transistor.

The circuit described in FIGURE 2 utilizes an NPN transistor. In FIGURE 3 there is shown an arrangement for use with a PNP transistor. Here the voltage source as indicated is negative and the Zener and stabistor 10 and 11 respectively are biased in directions opposite from that shown in FIGURE 2. The circuit however, works in identical fashion.

In both the circuits of FIGURES 2 and 3, an increase in load voltage results in an increase in collector current. In FIGURE 4, however, a circuit arrangement is shown in which an increase in load voltage results in a decrease in collector current.

Here the Zener diodes 12 and 13 are connected between the base and the emitter. Here for typical circuit parameters, the voltage across the Zener diodes may be approximately 4.8 volts each. The temperature coefficient of the entire circuit, that is of emitter to ground may be approximately .002% degree centigrade, or .018 millivolt per degree centigrade. The input at the emitter is approximatley 9 volts. The current through the Zener diodes is equal to one milliamp. The transconductance is equal to 6000 micromhos.

This arrangement will be seen as similar to that described in FIGURE 2, for effectively the balanced transistor amplifier arrangement shown in FIGURE 1 is eliminated by combining the base to emitter temperature coefficient with the temperature coefficient of the reference to reduce it to a minimum. This arrangement is illustrative of the fact that a pair of Zeners may be used in place of a Zener, stabistor arrangement, provided proper circuit parameters are selected.

Figure 5:
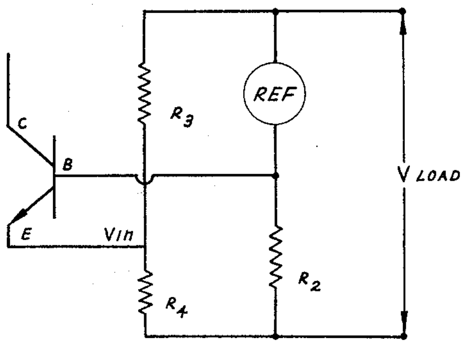
FIG. 5 shows still another modification of the invention in which the voltage reference diodes are connected between the base terminal and the output terminal bearing the regulated high potential.
Figure 6:
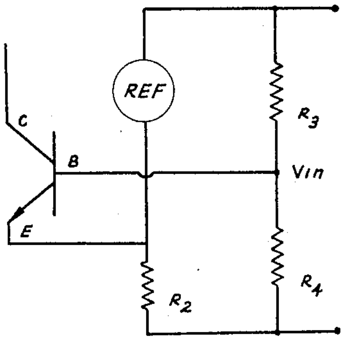
FIG. 6 shows a modification of the circuit illustrated in FIG. 5 in which the voltage reference diodes are in series with the emitter terminal instead of the base terminal.

In FIGURES 5 and 6 there is shown additional circuits which incorporate the structure of the present invention. Here the circuit shown in FIGURE 5 is somewhat similar to the circuit shown in FIGURE 2, while that shown in FIGURE 6 is somewhat similar to the circuit shown in FIGURE 4. The voltage reference in FIGURE 5 which may comprise the Zener diode and stabistor, is identical to that shown in FIGURE 2. Both must have a temperature coefficient which is equal to and opposite in polarization to the temperature coefficient of the base to emitter junction of the transistor. The reference component in FIGURES 4 and 6 are also identical. These must have a temperature coefficient which is equal and also which is polarized similarly to the temperature coefficient of the base to emitter junction of the transistor.

Figure 7:
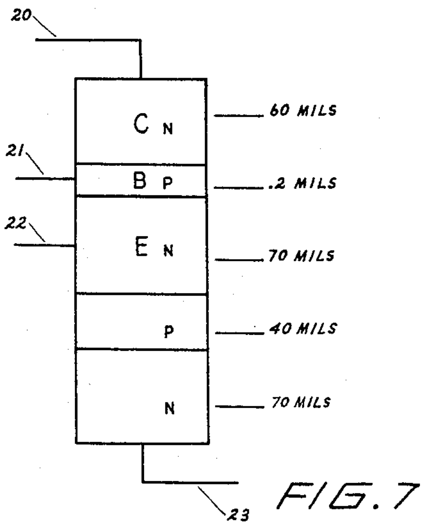
FIGURES 7 and 8 illustrate schematically physical embodiments of the present invention, and, FIGURE 9 illustrates a schematic equivalent circuit of the arrangement shown in FIGURE 8.

The arrangements described above may be made as a very compact and unitary physical package if desired. In FIGURE 7 there is illustrated schematically such an embodiment. Here a sandwich of three layers of semiconductive material are grown together to form an NPN transistor having a collector indicated at C, a base indicated at B, and an emitter indicated at E. Suitable leads are provided to the collector as indicated at 20 to the base as indicated at 21 and to the emitter as indicated at 22. A layer of P type semi-conductor material is then grown to the end of the emitter, thereby forming effectively a Zener diode integrally with the remainder of the semiconductor material. After this, the melt is very heavily doped with N type of material as indicated by the lowermost layer to obtain a diode biased in the forward direction. A lead indicated at 23 is connected to this layer. Typical thicknesses of the five layer sandwich would contemplate, as indicated in the drawings, 16 mils for the collector; 0.2 mil for the base; 70 mils for the emitter; 40 mils for the P type layer which forms partially the Zener diode, and 70 mils for the N type layer which partially forms the stabistor.

It will be noted that the emitter section must be quite wide to avoid interaction of the P type layer forming the Zener diode with the transistor portion of the device. The collector base and emitter portions of this particular device may act similar to a commercial 2N474 transistor. The lower portion of the middle-most layer and the 40 mil P layer act similar to a Zener diode which may comprise a commercial SV7 diode. The lower-most layer acts similarly to an SG22 diode. This circuit is similar schematically to that shown in the enclosed rectangle of FIGURE 2.

Figure 8:
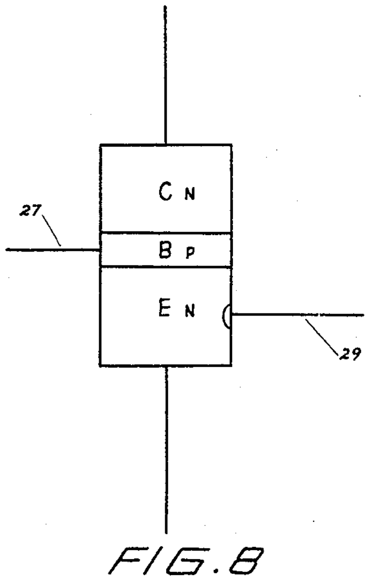
Figure 9:
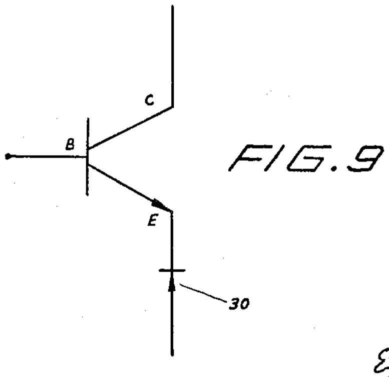

In FIGURE 8, there is shown another schematic arrangement of a grown junction device which may operate within the concepts of the present invention. Here a three layer device is of grown NPN variety. The uppermost N layer forms the collector and the suitable lead 26. The center layer forms the base having a lead 27, the lower-most layer forms the emitter having a lead 28. The emitter is made fairly thick so that an aluminum wire 29 may be alloyed or bonded to the lower-most end layer. This aluminum wire effectively forms a P type layer so that the equivalent circuit of FIGURE 8 is shown in FIGURE 9, with the diode 30 being formed of the aluminum wire and a portion of the lower-most N type layer. This may be used in conjunction with a stabistor to obtain the same results as shown in FIGURE 2. The stabistor may be eliminated and temperature compensation still obtained if the resistivity of the emitter layer is selected so that the temperature coefficient of the Zener diode portion formed between the emitter layer and the semiconducting region immediately adjacent to the aluminum wire 29 has a temperature coefficient of approximately +2.4 millivolts per degree centigrade.

There has been described a novel semiconductor circuit especially useful in connection with regulating a D.-C. output potential to remain substantially constant despite variations in temperature or current drawn from the constant potential terminal. The number of physical components and the physical size of the circuit is reduced. In addition, the circuit structure is so arranged that the temperature-sensitive elements are maintained at substantially the same temperature at all times so that transient effects due to temporary thermal gradients are minimized. It is evident that those skilled in the art may now make numerous modifications of and departures from the specific exemplary embodiments described herein. Consequently, the invention is to be constructed as limited only by the spirit and scope of the appended claims.

Having now described our invention, we claim:

1. A semiconductor circuit comprising, a semiconductor transistor having a plurality of rectifying junctions including a base-emitter junction, the potential across said base-emitter junction functionally related to temperature in a first sense, temperature compensating semiconducting means comprising at least one compensating rectifying junction in series with said base-emitter rectifying junction so that current flowing across said base-emitter junction flows across said compensating rectifying junction, the potential across said temperature compensating semiconducting means being functionally related to temperature in a sense opposite to said first sense to maintain the potential across the series combination of said base-emitter junction and said compensating semiconductor means substantially constant.

2. A semiconductor circuit in accordance with claim 1 wherein said temperature compensating semiconductor means comprises at least a Zener diode poled opposite to said base-emitter rectifying junction.

3. A semiconductor circuit in accordance with claim 2 wherein said temperature compensating semiconductor means further comprises at least a stabistor diode poled in the same sense as said base-emitter rectifying junction.

References Cited by the Examiner

UNITED STATES PATENTS

| | | | |
|---|---|---|---|
| 2,663,806 | 12/53 | Darlington | 317—235 |
| 2,667,607 | 1/54 | Robinson | 317—234 |
| 2,681,993 | 6/54 | Shockley | 179—171 |
| 2,693,568 | 11/54 | Chase | 323—22 |
| 2,703,855 | 3/55 | Koch et al. | 317—234 |
| 2,709,787 | 5/55 | Kircher | 179—171 |
| 2,734,164 | 2/56 | Knowlton | 323—66 |
| 2,751,550 | 6/56 | Chase | 323—22 |
| 2,831,126 | 4/58 | Linvill | 307—88.5 |
| 2,850,695 | 9/58 | Bishop | 323—66 |
| 2,866,944 | 12/58 | Zelina. | |
| 2,874,232 | 2/59 | Jochems | 317—235 |
| 2,932,783 | 4/60 | Mohler | 323—22 |
| 3,069,617 | 12/62 | Mohler | 323—22 |
| 3,103,617 | 9/63 | Schneider | 323—22 |

OTHER REFERENCES

Kopaczek: "Design of Transistor Regulated Power Supplies," Proc. IRE, July 1958, p. 1537.

LLOYD McCOLLUM, *Primary Examiner.*

E. JAMES SAX, MILTON O. HIRSHFIELD, *Examiners.*